United States Patent
Ono et al.

(10) Patent No.: US 8,541,929 B2
(45) Date of Patent: Sep. 24, 2013

(54) PIEZOELECTRIC DEVICES AND METHODS FOR MANUFACTURING SAME

(75) Inventors: Kozo Ono, Saitama (JP); Takehiro Takahashi, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 367 days.

(21) Appl. No.: 12/590,998

(22) Filed: Nov. 17, 2009

(65) Prior Publication Data

US 2010/0123369 A1    May 20, 2010

(30) Foreign Application Priority Data

Nov. 17, 2008  (JP) ................................. 2008-292896

(51) Int. Cl.
*H01L 41/22*    (2013.01)
(52) U.S. Cl.
USPC ............................ 310/348; 310/370; 29/25.35
(58) Field of Classification Search
USPC ........................ 310/348, 370, 363, 365, 366
See application file for complete search history.

(56) References Cited

U.S. PATENT DOCUMENTS

| | | | | |
|---|---|---|---|---|
| 5,030,875 | A * | 7/1991 | Knecht | 310/346 |
| 5,925,973 | A * | 7/1999 | Eda et al. | 310/348 |
| 7,034,441 | B2 * | 4/2006 | Ono et al. | 310/344 |
| 7,218,036 | B2 * | 5/2007 | Shimodaira et al. | 310/340 |
| 7,484,279 | B2 * | 2/2009 | Aoki | 29/25.35 |
| 2004/0169444 | A1 * | 9/2004 | Higuchi et al. | 310/348 |
| 2004/0217673 | A1 * | 11/2004 | Unno et al. | 310/348 |
| 2006/0066185 | A1 * | 3/2006 | Tanaya | 310/370 |
| 2007/0057597 | A1 * | 3/2007 | Aoki | 310/313 B |
| 2009/0195125 | A1 * | 8/2009 | Matsugi | 310/348 |

FOREIGN PATENT DOCUMENTS

| | | |
|---|---|---|
| JP | 06-343017 | 12/1994 |
| JP | 08-125491 | 5/1996 |
| JP | 08-162901 | 6/1996 |
| JP | 09-186552 | 7/1997 |
| JP | 10-022773 | 1/1998 |
| JP | 10-032293 | 2/1998 |
| JP | 11-054531 | 2/1999 |
| JP | 2000-049560 | 2/2000 |
| JP | 2004-129223 | 4/2004 |
| JP | 2004-214787 | 7/2004 |
| JP | 2005-130371 | 5/2005 |
| JP | 2007-181130 | 7/2007 |
| JP | 2008-174424 | 7/2008 |

OTHER PUBLICATIONS

Office Action for related Japanese Patent Application No. 2008-292896.

* cited by examiner

*Primary Examiner* — Derek Rosenau
*Assistant Examiner* — Bryan Gordon
(74) *Attorney, Agent, or Firm* — Klarquist Sparkman, LLP

(57) ABSTRACT

Piezoelectric devices and method for making them are disclosed. An exemplary piezoelectric device has a package base defining a cavity on a first surface thereof. An opposing second surface of the package base has at least one through-hole, a mounting electrode on which a piezoelectric vibrating piece is attached, and a respective sealing electrode sealing each through-hole. At least one external electrode is on the second surface, and a lid is bonded to the package base to enclose the piezoelectric vibrating piece. The mounting electrode, sealing electrodes, and external electrodes are formed integrally.

4 Claims, 8 Drawing Sheets

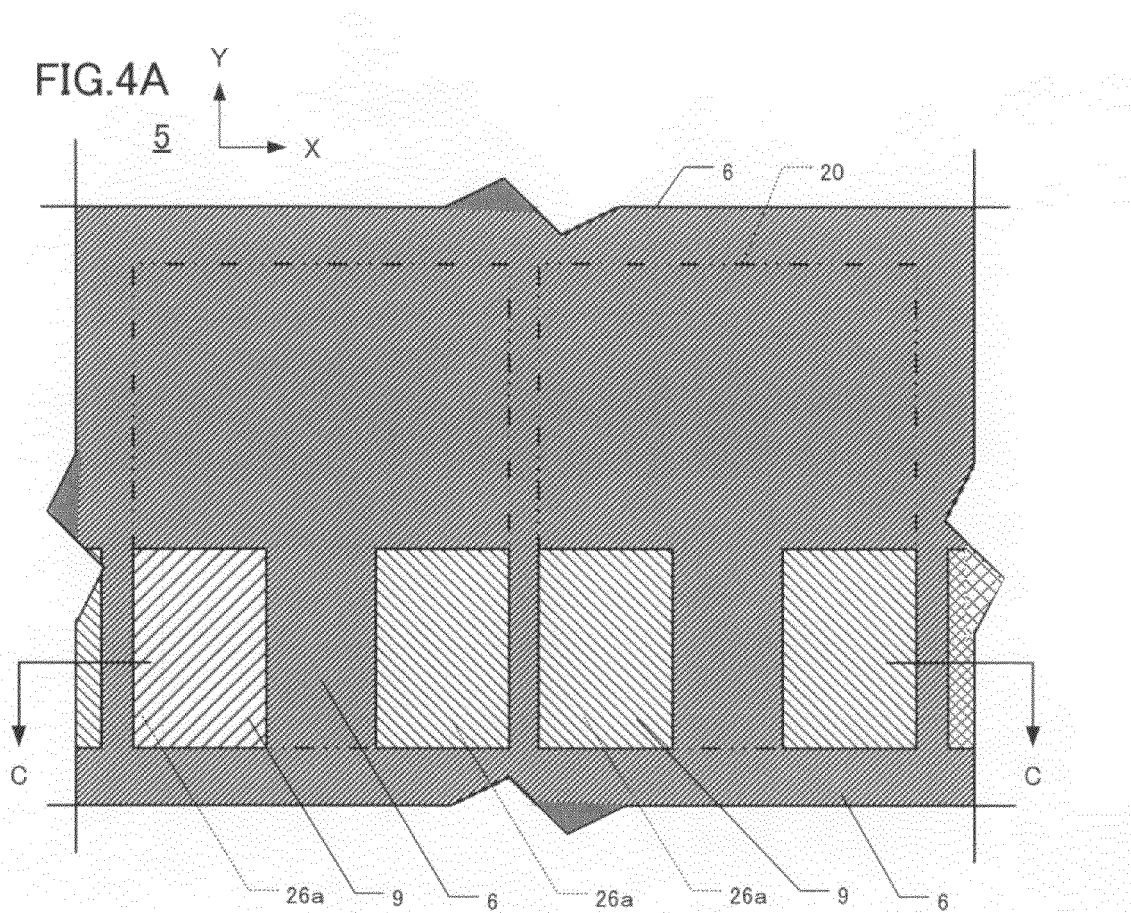
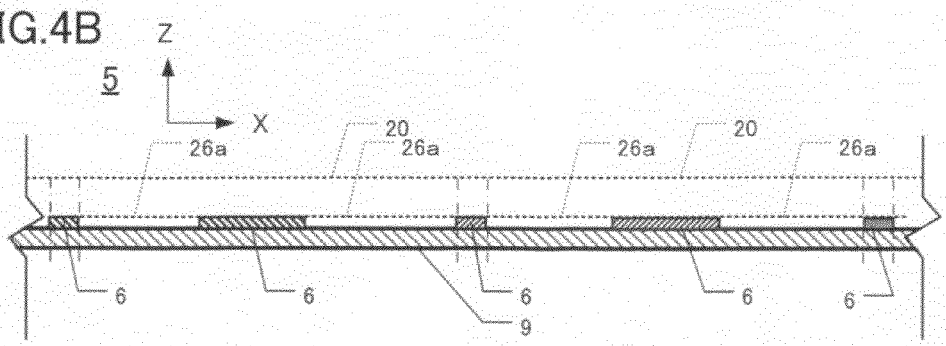

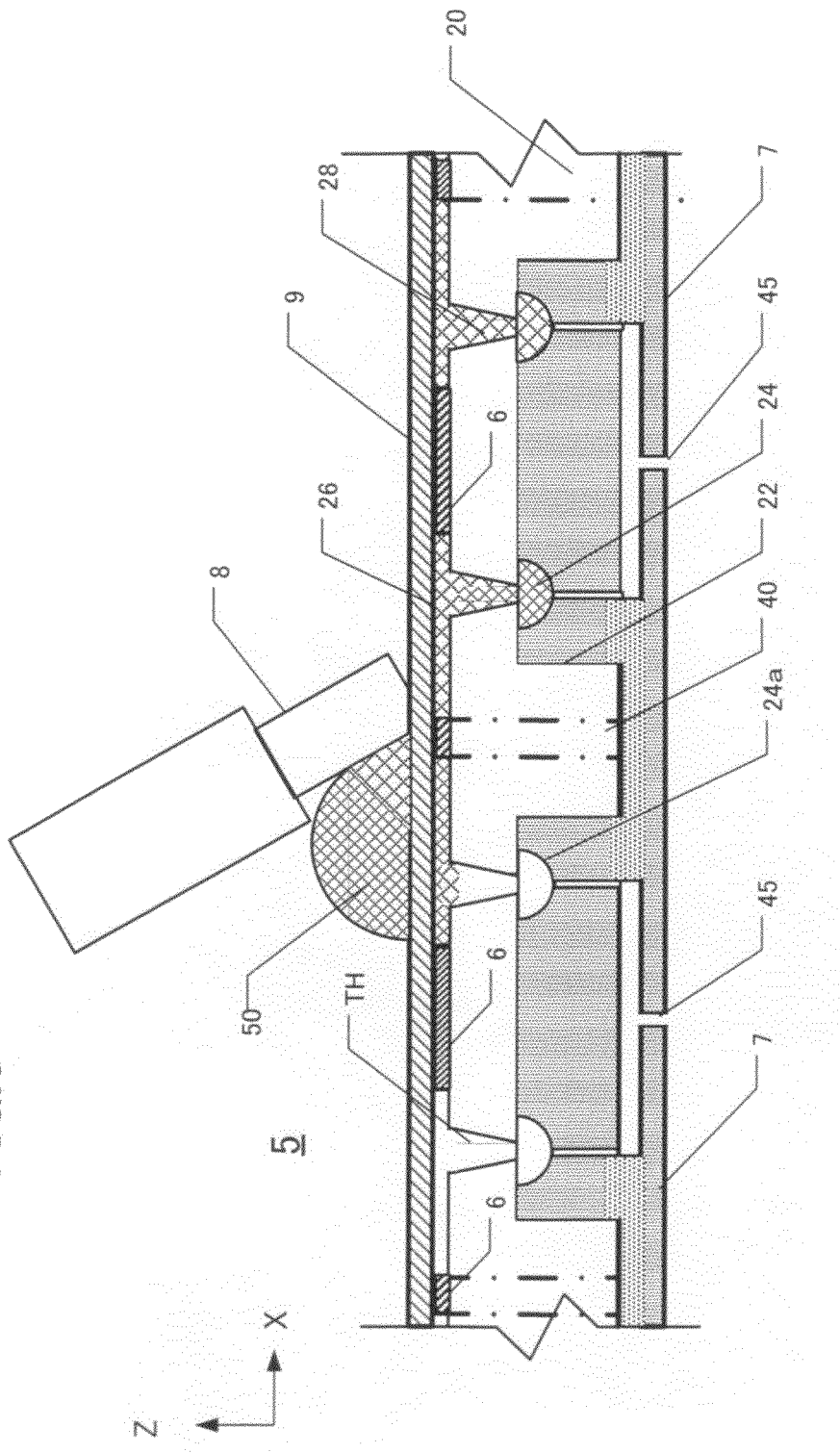

PIEZOELECTRIC DEVICES AND METHODS FOR MANUFACTURING SAME

CROSS-REFERENCE TO RELATED APPLICATION

This application claims priority to and the benefit of Japan Patent Application No. 2008-292896, filed on Nov. 17, 2008, in the Japan Patent Office, the disclosure of which is incorporated herein by reference in its entirety.

FIELD

This disclosure pertains to, inter alia, piezoelectric devices comprising a piezoelectric vibrating piece contained inside a package, and to methods for manufacturing such a piezoelectric device.

DESCRIPTION OF THE RELATED ART

With the progress of miniaturization and/or increases in the operating frequency of mobile communication apparatus and office automation (OA) equipment, piezoelectric vibrators used in this equipment must be progressively smaller and/or operate at higher frequency. Furthermore, there are relentless requests for cost reductions in the manufacturing of piezoelectric oscillators, particularly reductions achievable by simplifying the configuration of the oscillators and/or by simplifying or reducing manufacturing steps.

A piezoelectric oscillator is an exemplary piezoelectric device in which a piezoelectric vibrating piece is contained in a package. The typical package includes a housing and a lid defining an interior space in which the piezoelectric vibrating piece is located. The housing and lid can be formed of metal, glass, and/or or ceramic. The pieces of the housing are bonded together by an adhesive applied on the bonding surfaces of the pieces. The package is placed in a vacuum or inert-gas environment in which a sealing material is applied to through-holes in the package to seal the through-holes. The sealing material typically is melted by application of heat to cause the sealing material to flow into the through-holes and seal them. An example piezoelectric oscillator of this type is disclosed in Japanese Unexamined Patent Application 2004-214787.

The piezoelectric oscillator disclosed in the JP '787 reference includes a cavity defined in a package base and is manufactured by a method comprising many separate steps. The package base is comprised of silicon. Through-holes are defined in respective locations on the base intended to contact respective connecting electrodes of the piezoelectric oscillator. A through-hole electrode is formed inside each through-hole and connected to a respective mounting electrode. The piezoelectric oscillator inside the package is bonded to the mounting electrodes using an electrically conductive adhesive applied to the mounting electrodes. After the through-holes are filled with adhesive and cured, the package lid and package base are bonded together in a vacuum or inert-gas atmosphere. However, gas may be generated from the process of bonding together the lid and package base. This gas may be absorbed by the piezoelectric vibrating piece inside the package, and may adversely affect the long-term stability of the vibrating piece.

Further regarding the JP '787 reference, the mounting electrodes are defined by voids in a previously applied mask, followed by sputtering or plating of the unmasked areas to form the mounting electrodes. As a result of having to perform all these discrete steps, alignment of the mounting electrodes to the through-hole electrodes and connecting electrodes consumes much time and reduces work efficiency.

In view of the above, an object of the instant invention is to provide piezoelectric oscillators exhibiting substantially no fluctuation of oscillation frequency and that can be manufactured with greater accuracy, higher durability, and reduced cost.

SUMMARY

According to a first aspect of the invention, methods are provided for manufacturing piezoelectric devices. In an embodiment of such a method, a package base is prepared having first and second opposing major surfaces. On a first major surface is a cavity and at least one through-hole penetrating from the cavity to the second major surface. The first major surface is destined to be an interior surface of the device, and the second major surface is destined to be an exterior surface. At least one external electrode is formed on the second major surface. At least one sealing electrode is formed that seals the through-hole and that is electrically connected to the respective external electrode. Formed at the same time is at least one mounting electrode that is formed in the cavity and electrically connected to the respective sealing electrode. This simultaneous formation of electrodes is achieved by applying conductive paste on the second surface. The external electrode(s), sealing electrode(s), and mounting electrode(s) are "fired" (e.g., sintered) simultaneously by exposure to elevated temperature. A piezoelectric vibrating piece is mounted, using electrically conductive adhesive, on the at least one mounting electrode. Then, a package lid is attached to the base, thereby enclosing the piezoelectric vibrating piece in a space defined by the lid attached to the package base, thereby completing manufacture of the piezoelectric device. In this method, the external electrode(s), sealing electrode(s), and mounting electrode(s) are formed simultaneously, which simplifies the manufacturing process and reduces manufacturing cost.

In another embodiment of a method for manufacturing a piezoelectric device, a package base is prepared having first and second opposing major surfaces. A cavity is formed on the first major surface, and at least one through-hole is formed that penetrates from the cavity to the second major surface. At least one external electrode is formed on the second major surface, and at least one sealing electrode is formed that seals the respective through-hole and becomes electrically connected to the respective external electrode. At least one mounting electrode is formed in the cavity that is electrically connected to the respective sealing electrode by application of electrically conductive paste on the second major surface. A piezoelectric vibrating piece is placed on the mounting electrode(s), followed by simultaneous firing of the external electrode(s), sealing electrode(s), and mounting electrode(s). Then, a package lid is applied to the package base. In this embodiment the external electrode(s), sealing electrode(s), and mounting electrode(s) are formed simultaneously after the piezoelectric vibrating piece is mounted on the mounting electrode(s).

In some embodiments, during the electrode-forming step summarized above, the sealing electrode(s) and the mounting electrode(s) are formed by applying suction to the through-hole at which a female die for forming the mounting electrode(s) has been placed. Suction draws electrically conductive paste into the through-holes. Thus, the sealing electrode(s) and mounting electrode(s) are formed precisely at the same time, as the sealing electrode(s) reliably seal the respective through-holes.

In some embodiments, during the electrode-forming step summarized above, the conductive paste is urged, by application of suction, downward from the second major surface through the female die to the first major surface. To perform this step, the first major surface desirably is oriented face-down. The conductive paste can be applied using a so-called silkscreen-printing technique to form the external electrode(s), the sealing electrode(s), and the mounting electrode(s) simultaneously.

Various method embodiments can include a dicing step after bonding the lid to the package base. The dicing step is particularly indicated whenever multiple piezoelectric devices have been formed on a two-layer sandwich comprising a base wafer and a lid wafer. Specifically, the dicing step is performed after the lid wafer has been registered with and bonded to the base wafer. The lid wafer contains multiple (usually a large number of) lids, and the base wafer contains correspondingly multiple (usually a large number of) package bases.

According to another aspect, piezoelectric devices are provided that include a piezoelectric vibrating pieces contained in respective packages. Each package comprises a package base and a lid bonded to the package base, which defines an interior space in which the piezoelectric vibrating piece is situated and mounted. The package base has first and second major surfaces, and a cavity is defined on the first major surface. At least one through-hole is situated on the second major surface, extending to the first major surface. In the cavity is at least one mounting electrode to which the piezoelectric vibrating piece is mounted. The second major surface includes at least one external electrode electrically connected to a respective through-hole. A lid is bonded to the package base so as to enclose the piezoelectric vibrating piece. The mounting electrode(s), respective sealing electrode(s), and respective external electrode(s) are formed simultaneously to produce respective sets of these electrodes, each set including a respective mounting electrode, sealing electrode, and external electrode integral with each other. Piezoelectric devices having such a configuration are suitable for mass production, which substantially reduces their manufacturing cost.

The package base desirably is made of a glass material, and the conductive paste desirably comprises glass. Desirably, if the conductive paste is a glass-containing paste, the package base desirably is comprised of glass. By including glass in both the package base and paste, good adhesion can be achieved of the through-holes with the respective sealing electrode(s).

Desirably, the conductive paste has substantially the same coefficient of thermal expansion coefficient as the package base. Thus, the coefficients of thermal expansion of the mounting electrode(s), sealing electrode(s), and external electrode(s) are substantially equal. Such a piezoelectric device situated in a changing-temperature environment is resistant to adverse effects such as peeling of electrodes or formation of gaps between the electrodes and the package base.

In some embodiments the package base comprises borosilicate glass, and the lid comprises glass or silicon on which a metal film has been formed. This configuration allows the package base and lid to be bonded together by anodic bonding. Alternatively, the package base and lid can be bonded together using epoxy resin.

The various embodiments of piezoelectric oscillators as described herein exhibit piezoelectric oscillations that do not fluctuate in terms of oscillation frequency. The oscillators thus have long-term stability and can be manufactured using methods, described herein that are more economical to execute than conventional methods, thereby reducing manufacturing costs.

BRIEF DESCRIPTION OF THE DRAWINGS

FIG. 4A is plan view of a portion of a printing mask used for positioning and forming electrodes.

FIG. 4B is a cross-sectional view along the line C-C in FIG. 4A.

FIG. 6 is depiction of an exemplary technique for forming the mounting electrode, the external electrode, and the sealing electrode simultaneously using a screen-printing technique.

DETAILED DESCRIPTION

First Embodiment of a Piezoelectric Oscillator

Figure 1A:
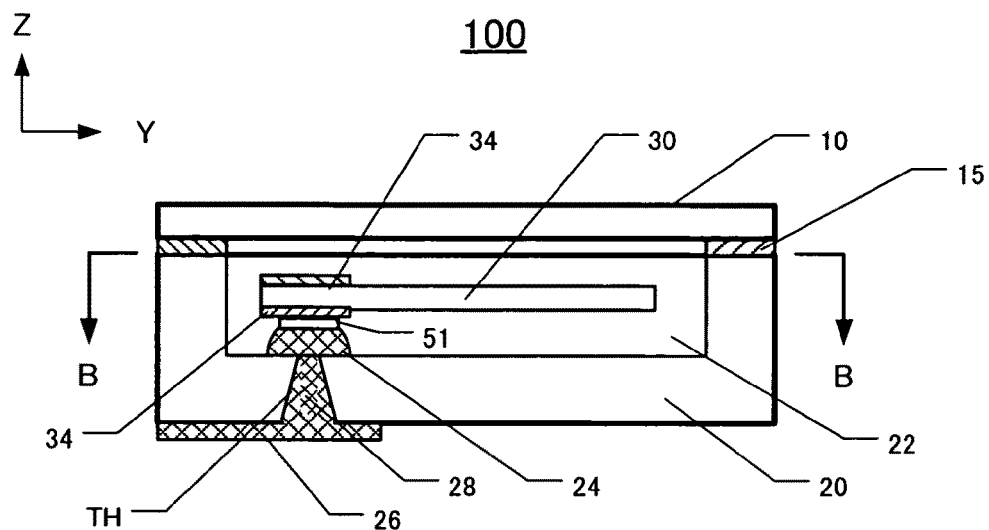
FIG. 1A is a cross-sectional view of a first embodiment of a piezoelectric oscillator, taken along the A-A line in FIG. 1B.
Figure 1B:
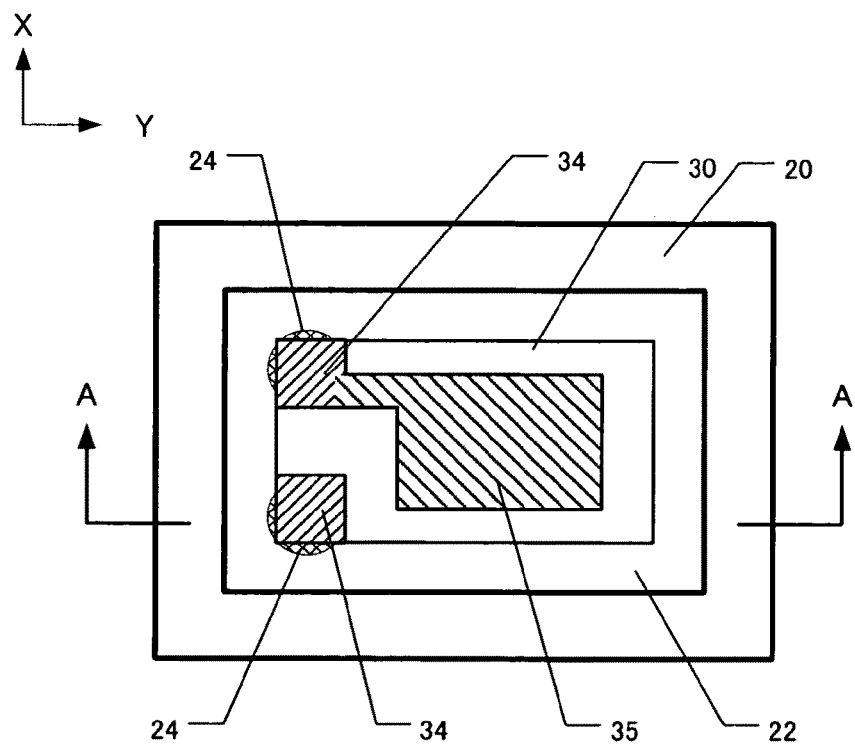
FIG. 1B is a plan sectional view of the embodiment shown in FIG. 1A, along the line B-B in FIG. 1A.

This embodiment of a piezoelectric oscillator 100 is described below with reference to FIGS. 1A and 1B. FIG. 1A is a cross-sectional view along the line A-A of the piezoelectric oscillator 100 shown in FIG. 1B. FIG. 1B is a plan sectional view along the line B-B in FIG. 1A. In FIG. 1A, the piezoelectric oscillator 100 comprises a lid 10 made of glass and a package base 20 made of borosilicate glass. The lid 10 has a planar plate-shape. A metal film 15 extends along a peripheral, upward-facing edge of the lid 10. The metal film 15 is made of aluminum and is formed using a sputtering or vacuum-deposition method. The package base 20 defines a cavity 22 in which a piezoelectric vibrating piece 30 is mounted. The piezoelectric vibrating piece 30 is aligned with through-holes TH and connected to the through-holes by connecting electrodes 34. The package base 20 also includes respective external electrodes 26 for the through-holes, respective sealing electrodes 28 for the through-holes TH, and respective mounting electrodes 24.

The cavity 22 is formed by etching part-way into the thickness of the package base 20 using hydrofluoric acid as a liquid etchant. This etching is normally performed to a glass wafer to which multiple package bases are attached, allowing multiple package bases to be formed simultaneously. The package base is masked wherever the cavity 22 is not to be formed.

The masking assures that the cavity is made to a desired shape. The half-depth etching is conducted by controlling the types and concentrations of hydrofluoric acid contacting the package base, as well as etching time and temperature. The through-holes TH are formed by wet-etching areas of the glass wafer that are not protected by mask. The through-holes TH can be formed at the same time as the cavity 22.

A first surface of the package base 20 is placed face-downward, and a conductive paste 50 is applied on the upward-facing second surface of the base 20 (FIG. 6). The external electrodes 26, sealing electrodes 28, and mounting electrodes 24 are formed simultaneously by registering a mold to the through-holes and applying suction to the through-holes TH. Thus, the through-holes TH are filled with and sealed by the conductive paste 50, as the mounting electrodes 24 become conductively connected to the external electrodes 26 via the sealing electrodes 28.

An exemplary conductive paste 50 is Ag paste comprising Ag (silver) filler and epoxy resin, or a conductive glass paste comprising a filler such as Ag, Au (gold), Pd (palladium), and glass. The curing temperature of Ag paste is 150° C., and curing time is more than 30 minutes, for example. The curing temperature of the conductive glass paste is 150° C., and its sintering temperature is more than 500° C. The maximum heat-resistance temperature of Ag paste after sintering is 640° C. so that it can withstand a temperature of 400° C. for anodic bonding or the temperature 260° C. of a reflow furnace for surface mounting. The conductive paste 50 desirably has the same coefficient of thermal expansion as the package base 20. Thus, whenever the temperature of the piezoelectric oscillator 100 changes, the probability of a gap forming between the sealing electrode 28 and through-hole TH is much lower than otherwise.

The mounting electrodes 24, external electrodes 26, and sealing electrodes 28 are simultaneously sintered, as achieved by curing and application of high heat to the package base 20. Then, electrically conductive adhesive such as Ag paste is applied on a surface of the mounting electrodes 24, and the connecting electrodes 34 of the piezoelectric vibrating piece 30 are bonded to the respective mounting electrodes 24 using the Ag paste. In a variation of this technique, after forming the mounting electrodes 24, external electrodes 26, and sealing electrodes 28, they are partially cured. An electrically conductive adhesive 51 such as Ag paste is applied on the respective surfaces of the mounting electrodes 24 to achieve bonding of the respective connecting electrode 34 of the piezoelectric vibrating piece 30 to the mounting electrode 24. Then, the mounting electrode 24, external electrode 26, sealing electrode 28, and electrically conductive adhesive 51 are sintered by simultaneous exposure to high temperature ("firing").

The lid 10, including a metal film 15, is arranged such that the metal film 15 can be applied to the peripheral, upward-facing edge of the cavity 22 in the glass base 20, followed by anodic bonding. In an exemplary technique of anodic bonding the "top" surface of the lid 10 and the "bottom" surface of the package base 20 are provided with respective negative potentials, while the metal film 15 is provided with a positive potential. These charged surfaces are heated to within the range of 200° C. to 400° C. while being exposed to a vacuum or inert-gas environment. A DC electric charge of 400 V is applied for 10 minutes, which completes the anodic bonding and thus the fabrication of the piezoelectric vibrator 100.

For bonding together the lid 10 and package base 20, epoxy resin can be applied to the entire peripheral edge of the concavity 22 of the package base 20. This allows a board-shaped lid 10 comprising glass or silicone to be bonded to the peripheral edge. After the epoxy resin on the peripheral edge of the cavity 22 has partially cured for one to two hours at room temperature, the lid 10 is placed on the package base 20. The package base 20 on which the lid 10 has been placed is then placed in a vacuum or inert-gas atmosphere at 150° C. to allow the cavity 22 to be evacuated or filled with inert gas, respectively, as hermetic bonding of the lid to the package base proceeds to full cure.

Note that the cavity 22 can be sealed air-tight by mounting the board-shaped lid 10 (made of glass) to the package base after low-melting-point (LMP) glass paste is applied to the peripheral edge of the package base surrounding the cavity 22. The LMP glass paste desirably has substantially the same coefficient of thermal expansion as the package base 20 (made of glass) and the lid 10, which prevents shear failure that otherwise would be caused by differential thermal expansion in the bonded areas.

As shown in FIG. 1B, the package base 20 is comprised of a borosilicate glass and contains a piezoelectric vibrating piece 30 within the cavity 22. The piezoelectric vibrating piece 30 is an AT-cut crystal vibrating piece that includes an excitation electrode 35 and a connecting electrode 34 on first and second surfaces thereof The piezoelectric vibrating piece 30 is connected to the mounting electrode 24, formed in the cavity 22, via the connecting electrode 34. The piezoelectric vibrating piece 30 can be replaced by a tuning-fork type crystal vibrating piece, if desired.

Embodiment of Method for Manufacturing Piezoelectric Oscillator

Figure 2:
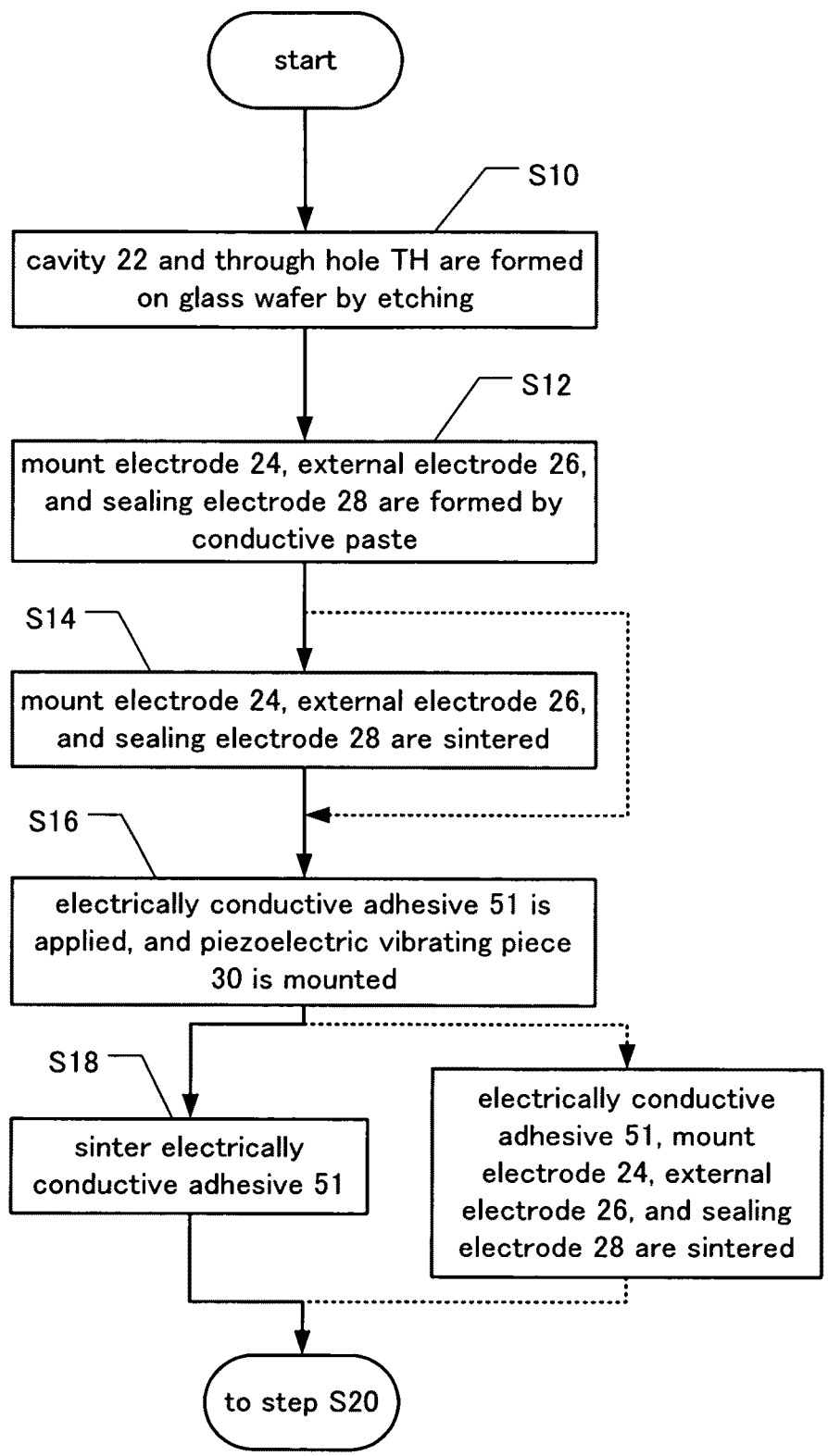
FIG. 2 is a flow chart of an embodiment of a method for forming a mounting electrode, an external electrode, and a sealing electrode of a glass package base formed from a glass wafer.
Figure 3:
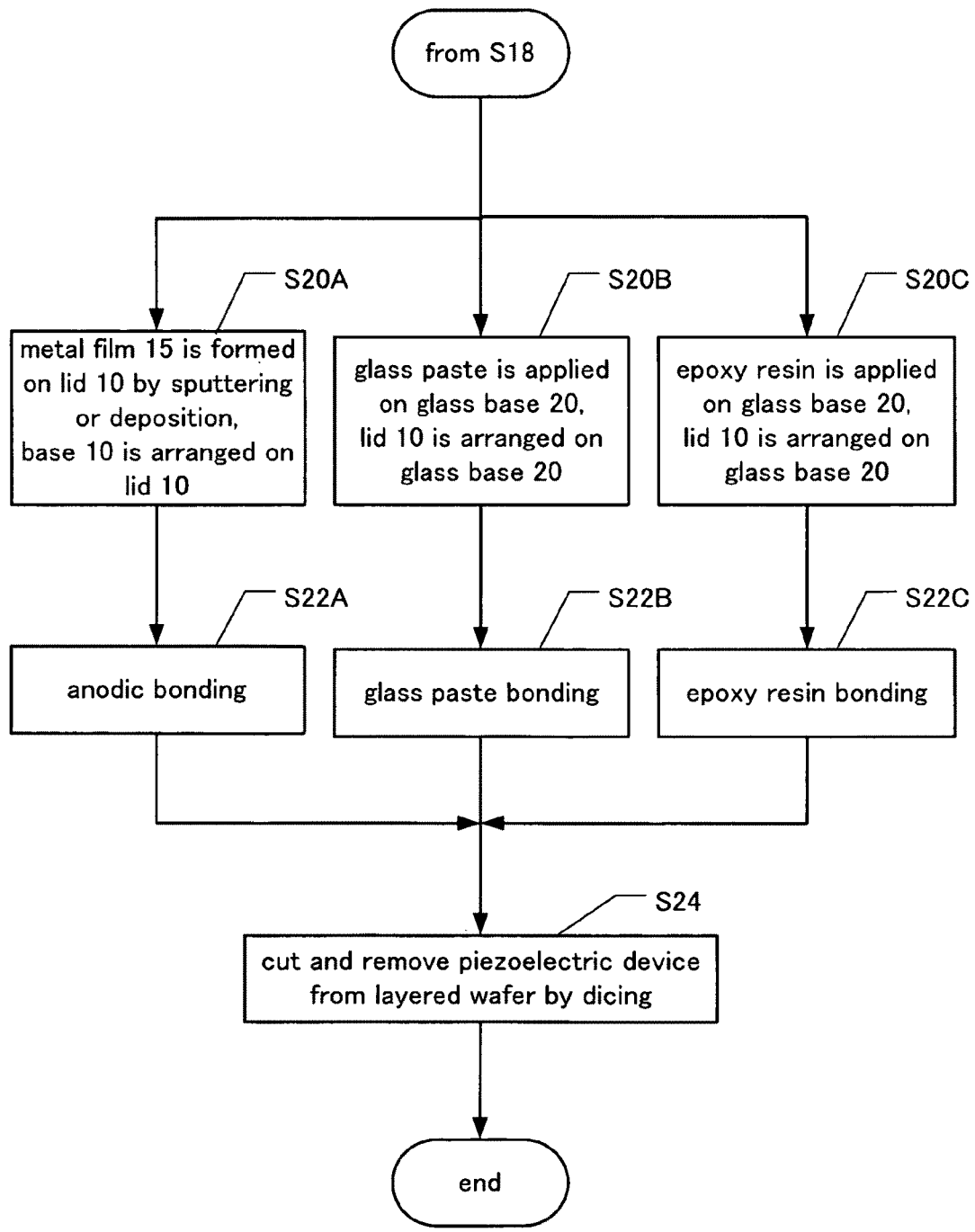
FIG. 3 is a flow chart of a method for manufacturing a piezoelectric oscillator by, inter alia, bonding a glass base and lid to form the package.

FIGS. 2 and 3 are respective flow charts showing an embodiment of a method of manufacturing a piezoelectric oscillator such as the embodiment 100 described above. FIG. 2 is directed to simultaneous formation of the mounting electrodes 24, external electrodes 26, and sealing electrodes 28 of a glass package base on a glass wafer. In step S10 a corrosion film is formed on the entire upper surface of a borosilicate glass wafer by sputtering or vacuum deposition. The corrosion film is a double-layer metal film comprising an Au (gold) layer on a Cr (chrome) layer. A photoresist layer is applied evenly on the corrosion film by spin-coating. A positive photoresist such as novolak resin, for example, can be used as the photoresist film. The photoresist film is formed into a mask using an exposure device (not shown). Exposure produces a mask that defines the profile outline of the cavity 22 to be formed on the upper surface of the glass wafer. A pattern of through-holes TH is exposed on the under-surface of the glass wafer. Portions of the gold layer now revealed by removal of the exposed photoresist are etched using an aqueous solution of iodine and potassium iodide. Then, portions of the underlying nickel layer revealed by removing corresponding portions of the gold layer are etched using, for example, an aqueous solution of ceric di-ammonium nitrate and acetic acid. The concentrations of these etchants, etching temperature, and etching time are controlled to avoid over-etch. Completion of etching results in complete removal of the corrosion film from the revealed locations.

Portions of the glass wafer revealed by selective removal of the photo-resist film and corrosion film are half-etched using hydrofluoric acid to form the profile outline of the cavity 22. Upon removing excess photo-resist and corrosion films, the cavity 22 and through-holes TH are formed. Each through-hole TH has a conical shape, with a wider opening on the under-surface.

In step S12, electrically conductive paste 50 is applied on the second surface of the glass wafer whose first surface is oriented face-down and that is covered by mask except for areas in which the external electrodes 26 are to be formed.

Then, the mounting electrode 24 is formed by application of suction to the through-holes TH to which a mold has been attached. Thus, the conductive paste 50 is drawn into the through-holes TH to fill and seal them, thereby integrally forming the mounting electrodes 24, sealing electrodes 28, and the external electrodes 26. An exemplary process for forming these electrodes will be described later below with reference to FIGS. 4 to 7.

In step S14, after drying the mounting electrodes 24 in the cavity 22, the external electrodes 26, and the sealing electrodes 28 at room temperature, sintering thereof is performed by curing or firing. As indicated by the dotted line in FIG. 2, after drying and partially curing the mounting electrodes 24, external electrodes 26, and sealing electrodes 28 at room temperature, step S14 can be skipped and the process can advance to step S16.

In step S16 electrically conductive adhesive 51, such as Ag paste, is applied to the mounting electrodes 24 and connecting electrodes 34 of the piezoelectric vibrating piece 30 to mount the piezoelectric vibrating piece to the mounting electrode 24.

In step S18 the electrically conductive adhesive 51 bonding the connecting electrodes 34 and mounting electrodes 24 is sintered. Note that, if step S14 is skipped, as indicated by the dotted line, the mounting electrodes 24 in the cavity 22, the external electrodes 26, the sealing electrodes 28, and the electrically conductive adhesive 51 can be sintered simultaneously by firing.

FIG. 3 is specifically directed to bonding the lid 10 to the glass package base 20. Because there are three possible methods by which the base 20 can be attached to the lid 10, steps S20A-S22A, S20B-S22B, and S20C-S22C will be described individually.

In step S20A a metal film 10 comprising aluminum is formed by sputtering or vacuum deposition on the peripheral edge of the board-shaped lid 10 made of glass or silicon. The lid 10 is placed on the peripheral edge of the cavity 22 in the package base 20. Then, the process advances to step S22A.

In step S22A the assembly comprising the package base 20, metal film 15, and lid 10 are placed in a vacuum or inert-gas environment and heated to 200° C. to 400° C. to perform anodic bonding of the lid 10 to the package base 20. Anodic bonding completes formation of the piezoelectric oscillator 100. Then, the process advances to step S24.

In an alternative bonding technique, in step S20B LMP glass paste is applied to the peripheral edge of the cavity 22 of the glass base 20. Then, the board-shaped lid 10, comprising glass or silicon, is placed on the peripheral edge of the cavity 22. The process then advances to step S22B.

In step S22B, the glass package base 20, on which the lid 10 has been placed, is placed at more than 500° C. in a vacuum or inert-gas environment. Thus, the LMP glass paste is melted to bond together the lid 10 and the glass base 20. Even though a small amount of gas is released from the LMP glass paste during this heating process, the interior of the cavity 22 of the package base 20 is maintained in a vacuum condition or filled with inert gas and hermetically sealed. Then, the process advances to step S24.

As an alternative bonding technique, in step S20C epoxy resin is applied to the entire peripheral edge around the cavity 22 of the package base 20. After drying the epoxy resin for one or two hours at a room temperature, the board-shaped lid 10 comprising glass or placed on the glass base 20. The process then advances to step S22C.

In step S22C, the lid 10 is bonded to the package base by heating the base 20, (onto which the lid 10 has been placed) at a temperature of more than 150° C. in a vacuum or inert-gas atmosphere. The small amount of gas released from the epoxy resin in this step is exhausted. Thus, the interior of the cavity 22 in the package base 20 is maintained at a vacuum state or filled with an inert gas and hermetically sealed. The process now advances to step S24. Since multiple piezoelectric devices are produced on each wafer, they are detached from the wafer using a dicing saw or the like. Forming multiple piezoelectric devices at the wafer level also eliminates any need to handle or manipulate small parts, which simplifies and increases the productivity of the manufacturing process.

Forming Mounting Electrodes, External Electrodes, and Sealing Electrodes

FIGS. 4 to 7 depict simultaneous formation of the mounting electrodes 24, external electrodes 26, and sealing electrodes 28. FIGS. 4A and 4B depict a print mask used for forming these electrodes. FIG. 4A is a plan view of a portion of a printing mask 5 as viewed from the resist-film side (resist film is item 6). Hatching corresponds to respective printed patterns 26a of the external electrodes 26 on each glass base 20, shown for the purpose of illustration. FIG. 4B is a cross-sectional view along the line C-C of FIG. 4A. FIG. 4B also shows virtual lines corresponding to the printing patterns 26a and glass base 20.

As shown in FIGS. 4A and 4B, the printing mask 5 includes a resist film 6 with openings corresponding to the printing patterns 26a of the external electrodes 26. The printing mask is formed on a "screen" 9 or net-like structure of enmeshed or woven metal wires (e.g., stainless steel) or chemical fibers. The openings for the printing patterns 26a are areas of the screen in which resist film is absent. Thus, the printing mask 5 is a so-called screen-printing mask. Other types of masks can alternatively be used.

The resist film 6 is a polymer resin film or a metal film. The metal film is formed of Ni, Cr, or Ni/Cr by vacuum deposition or sputtering. Metal film enhances the durability of the printing mask 5, compared to a mask having a polymer resin film. During use of the printing mask, conductive paste does not pass through areas of the screen 9 in which the resist film 6 is present, but does pass through areas in which the resist film 6 is absent.

Figure 5A:
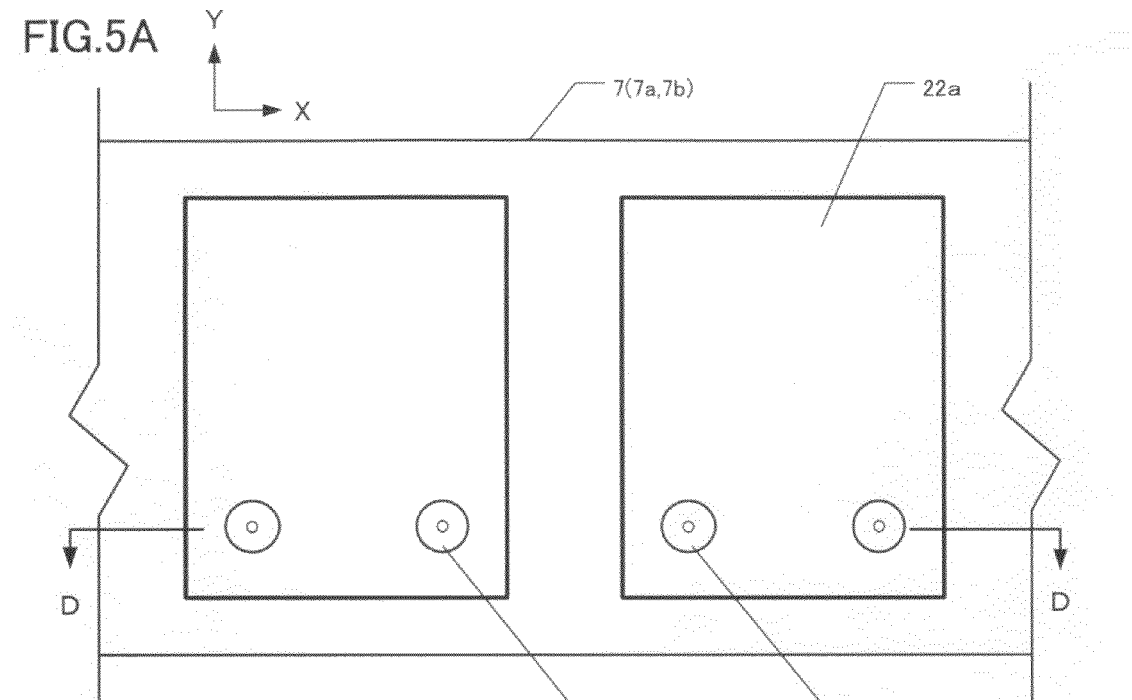
FIG. 5A is a front view of a portion of a mold used for forming certain electrodes.
Figure 5B:
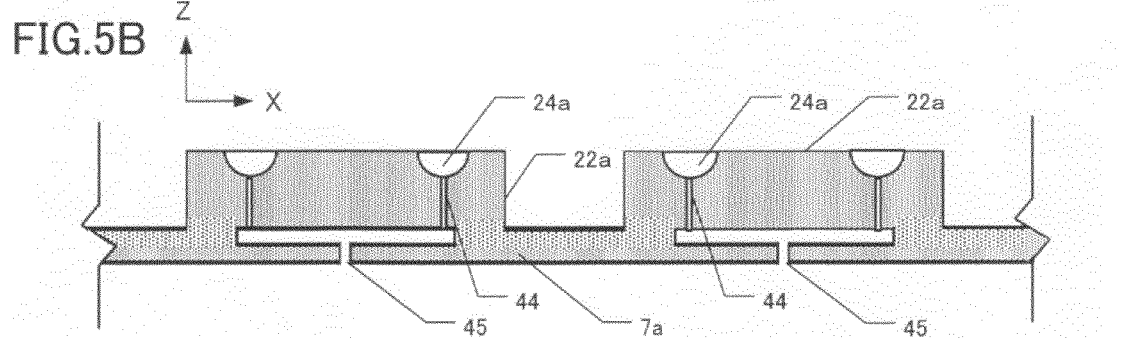
FIG. 5B is a cross-sectional view along the line D-D in FIG. 5A.
Figure 5C:
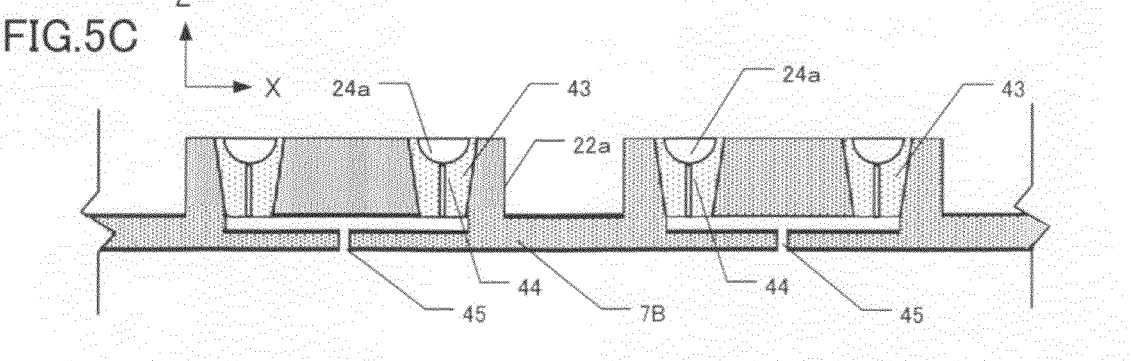
FIG. 5C is a cross-sectional view along the line D-D of a mold comprising a mounting-electrode mold.

FIGS. 5A-5C depict an embodiment of a mold 7 (comprising a first mold portion 7a and a second mold portion 7b) intended to be inserted to the cavity 22 of a glass package base for use in forming the mounting electrodes 24. FIG. 5A is a partial front view of the mold 7. FIG. 5B is a cross-sectional view along the line D-D in FIG. 5A. FIG. 5C is a cross-sectional view along the line D-D of a mold portion 7b including a mounting-electrode mold 43.

In FIGS. 5A and 5B, the first mold portion 7a includes an insert portion 22a intended to be inserted into a respective cavity. Each insert portion 22a includes female dies 24a for forming respective mounting electrodes 24. Each female die 24a has a hemispherical shape and is connected via a respective hole 44 to a suction tube 45. The suction tube 45 is connected to a vacuum pump (not shown). Each insert portion 22a is slightly smaller than the cavity 22. The first mold portion 7a can be made of polyurethane rubber, for example.

As shown in FIG. 5C, the second mold portion 7b includes mounting-electrode molds 43 on each insert portion 22a for forming respective mounting electrodes 24. With the mounting-electrode mold 43, removing the mold from the cavity 22 can be easier. The second mold portion 7b can be made of polyurethane rubber, for example. Each mounting-electrode mold 43 includes a respective female die 24a that also is hemispherical in shape. Each female die 24a is connected to a hole 44, and the holes are connected to suction tubes 45.

The shape of the female die 24a desirably conforms to the shape of the mounting electrode 24, and can be modified to produce mounting electrodes of different shapes. For example, it can be square-shaped instead of hemispherical.

FIG. 6 depicts forming the mounting electrodes 24, external electrodes 26, and sealing electrodes 28 by screen-printing. A cutting section 40 extends along the borderlines of the external electrodes 26, is shown (dot-dash lines) for purposes of illustration. In FIG. 6, the package base 20 is placed under-surface up. Thus, the opposite surface (including the cavities 22) faces downward. Of the first mold portion 7a, the insert portions 22a are inserted in the respective cavities 22 of the package base 20. Thus, the female dies 24a, for forming respective mounting electrodes, on the insert portions 22a are placed adjacently, in automatic registration with, and in tight contact with the respective through-holes TH. The printing mask 5 is placed such that the resist film 6 faces the glass package base 20. Thus, the printing mask 5 is placed in contact with the upward-facing under-surface of the base 20. Note that the printing mask 5 prevents drooping of its net portion 9 and tightens the net portion 9 to allow the mask to be easily removed from the external electrodes 26.

Conductive adhesive paste 50 is applied to the upper surface of the printing mask 5. Using a squeegee 8, the conductive adhesive paste 50 is spread over the net portion 9. The applied amount of conductive paste 50 can be increased to accommodate increased thickness of the resist film 6 under the net portion 9. Note that the proximal ends of the through-holes (nearest the printing mask 5) are larger in diameter so that the conductive paste 50 is easily urged into the through-holes. The female dies 24a used for forming the mounting electrodes at the through-holes TH are subjected to vacuum suction using a vacuum pump (not shown) connected to the suction tubes 45. The vacuum suction draws electrically conductive paste 50 into the interiors of the through-holes and of the female dies 24a for the mounting electrodes. The degree of suction applied by the vacuum pump can be adjusted depending upon the viscosity of the conductive paste 50. In some instances a vacuum pump may not be necessary.

The squeegee 8 desirably is formed of an elastomeric material such as urethane rubber, with a hardness in the range of 60 to 90 as described in Japan Industrial Standard (JIS) K6253. After completing spreading of the conductive paste 50 using the squeegee 8, vacuum suction is stopped and the printing mask 5 is removed. Air may be discharged from the suction tubes 45 after passage of a designated time to reduce adhesion of the female dies 24a to the mounting electrodes 24 and to make the first mold portion 7a easier to remove. Thus, the mounting electrodes 24, external electrodes 26, and sealing electrodes 28 are formed simultaneously on the glass package base 20. In FIG. 6 the cutting section 40 is shown, which indicates lines along which the piezoelectric devices are cut from the wafer so that the dicing process can be easier.

If a second mold portion 7b, providing molds 43 for the mounting electrodes (FIG. 5C), is used, the mounting-electrode mold 43 and the second mold portion 7b can be easily separated from each other, which can eliminate having to use blown air to separate them.

Figure 7:
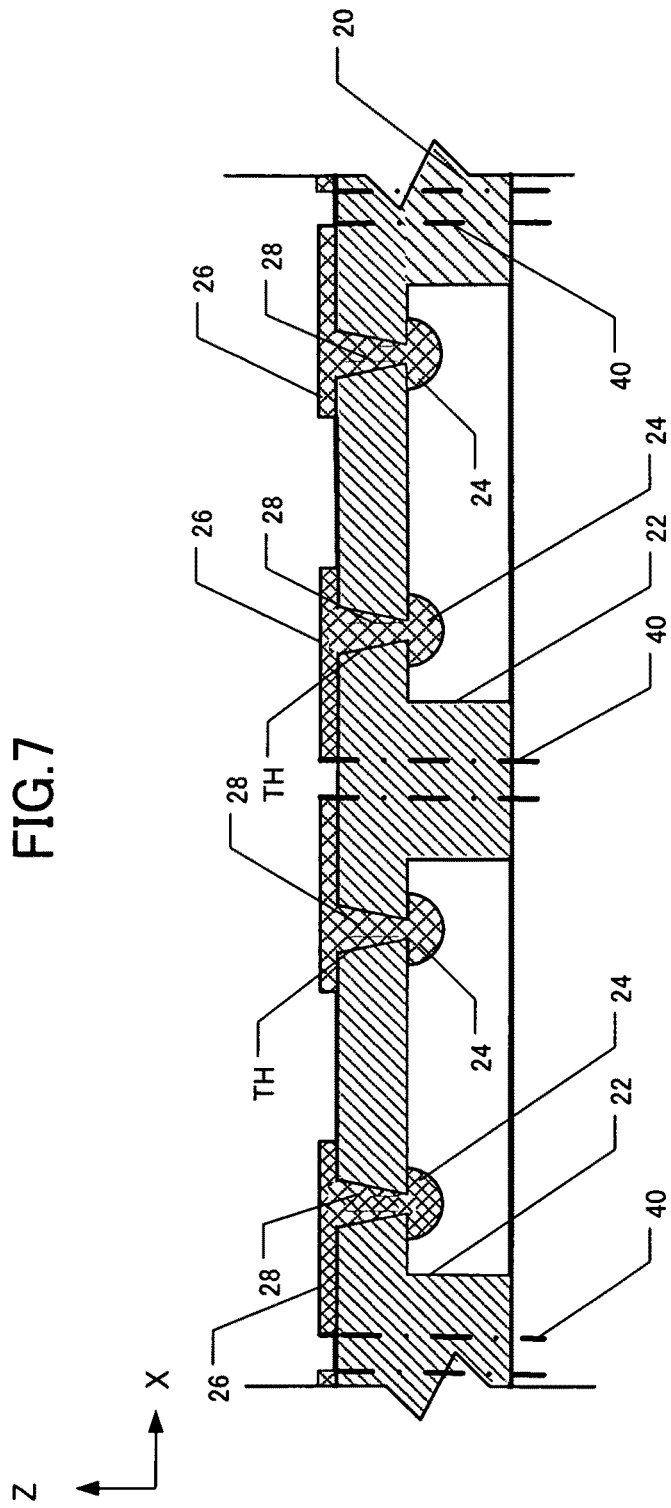
FIG. 7 is a cross-sectional view of a glass package base from which the printing mask and mold have been removed.

FIG. 7 is a cross-sectional view of the glass package base 20 from which the printing mask 5 and molds 7 have been removed. As shown in FIG. 7, on the package base 20, the mounting electrodes 24 are formed inside the cavity 22, the sealing electrodes 28 are formed on respective through-holes TH, and external electrodes are formed on the under-surface of the base. The through-holes TH are sealed by respective sealing electrodes 28. The cutting sections 40 along the outer edges of the external electrodes 26 are shown as dot-dash lines. Alternatively, the outer edges of the external electrodes 26 can serve as marks for cutting individual piezoelectric devices from the wafer sandwich in a dicing step.

The mounting electrodes 24, external electrodes 26, and sealing electrodes 28 are formed simultaneously by the process discussed above, so that manufacturing steps are simplified and/or eliminated, and costs reduced.

Anodic Bonding of the Wafer

Figure 8A:
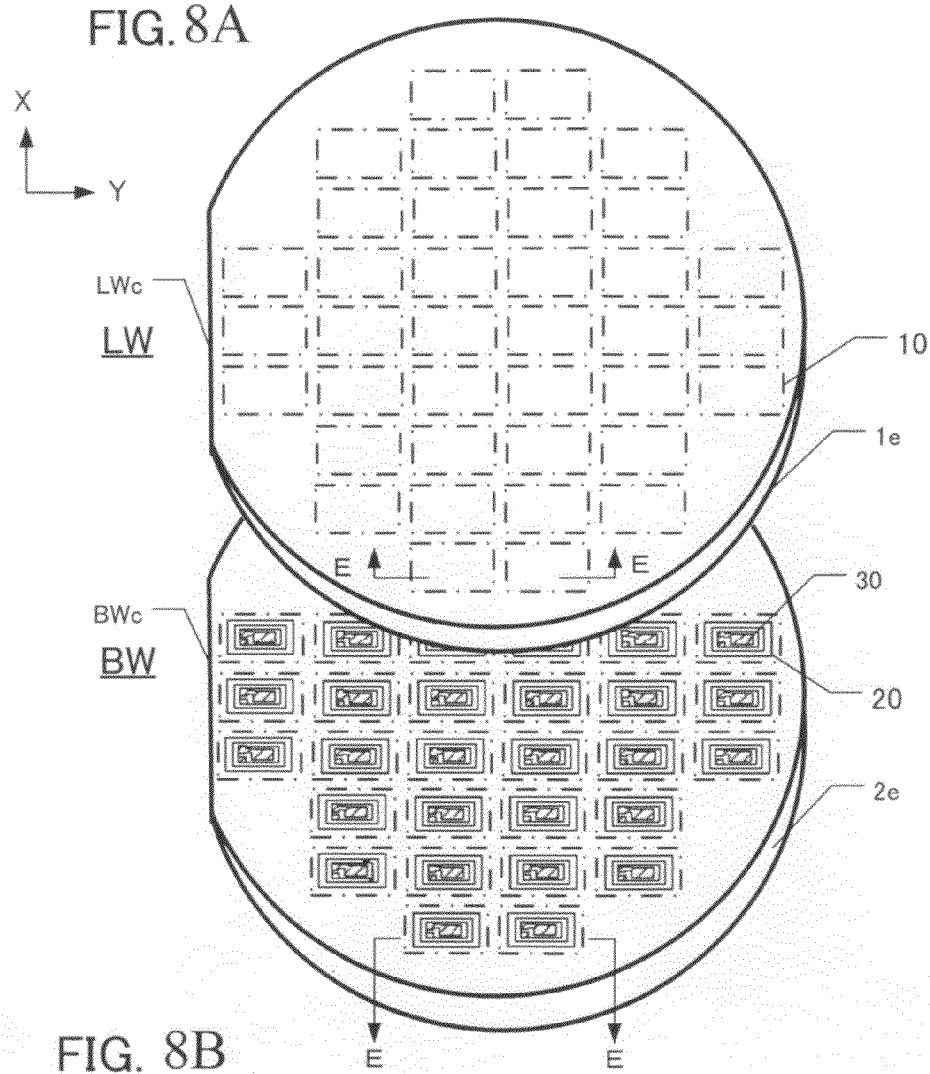
FIG. 8A is a perspective view of a lid wafer LW being aligned with a base wafer BW for simultaneous manufacture of multiple piezoelectric oscillators from the resulting two-layer sandwich.
Figure 8B:
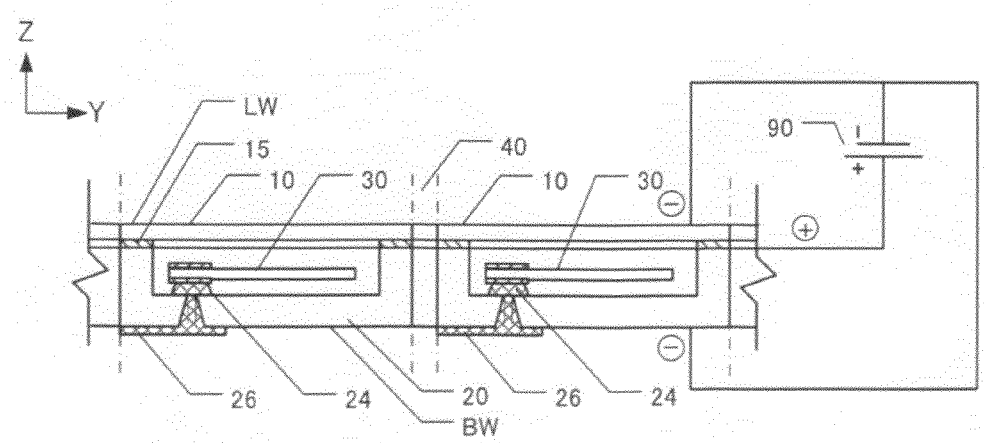
FIG. 8B is an elevational section view along the line E-E in FIG. 8A.

FIGS. 8A and 8B depict anodic bonding of the lid wafer LW to the base wafer BW in which piezoelectric vibrating pieces 30 are mounted within respective cavities 22. FIG. 8A is a perspective view showing alignment of the lid wafer LW with the base wafer BW. FIG. 8B is an elevational section along the line E-E line in FIG. 8A. Also shown in FIG. 8B is wiring used for performing the anodic bonding of the package. Multiple lids 10 are shown on the lid wafer LW, and multiple package bases 20 are shown on the base wafer BW, for illustration purposes, using virtual dot-dash lines. In FIG. 8A, thirty-eight lids 10 are shown on the lid wafer LW for ease of illustration; on an actual lid wafer LW, hundreds or thousands of lids 10 are typically formed.

In FIG. 8A, the diameter of the two wafers, the lid wafer LW and the base wafer BW made of glass, is four inches, for example. Also, each wafer LW, BW has a respective orientation flat LWc, BWc situated on a peripheral edge LWe, BWe, respectively, of the wafers to identify the axial direction. The wafers are aligned and registered with each other by aligning the orientation flats with each other.

In FIG. 8B, when the wafers are layered, a metal film 15 comprising aluminum is formed on the lid wafer LW by sputtering or vacuum deposition. On the base wafer BW, the cavities 22 and through-holes TH are formed by etching. Also formed on the base wafer are the mounting electrodes 24, the external electrodes 26, and the sealing electrodes 28. In each set of these electrodes, the constituent electrodes are integral with each other. A respective piezoelectric vibrating piece 30 is mounted to each pair of mounting electrodes 24.

FIG. 8B includes schematic wiring for performing anodic bonding of the lid wafer LW and the base wafer BW together. The package bases 20 (to which the piezoelectric vibrating pieces 30 are mounted) are made of borosilicate glass, for example. This type of glass contains a metal ion such as sodium ion. The lids 10 comprise the metal film 15 on their under-surfaces, wherein the metal film 15 desirably is made of aluminum. (Instead of aluminum, the metal film 15 can be a gold layer on a chrome layer.)

A two-layer sandwich of the wafers LW, BW is heated and subjected to a vacuum environment or inert-gas environment at 200° C. to 400° C. Meanwhile, the upper surface of the lid wafer LW and the under-surface of the base wafer BW are energized at a minus potential, while the metal film 15 of the under-surface of the lid wafer LW is energized at a positive potential. By way of example, a potential of 400 VDC from a DC power source is applied for 10 minutes. Thus, piezoelectric oscillators 100 are produced that have interiors that are at a desired vacuum level or pressure of inert gas.

Anodic bonding occurs by a chemical reaction involving oxidation of the metal on the bonding interface. To achieve anodic bonding, the electric field is applied between the metal film (anode) and the surface facing the bonding surface of the glass material (cathode). This potential causes metal ions such as sodium ions in the glass to migrate to the cathode. Consequently, the metal film contacting the glass material at the bonding interface is oxidized and the surfaces become bonded to each other. In this embodiment, anodic bonding is conducted such that, when a designated metal such as Al and a designated derivative are heated (200° C. to 400° C.) as a DC voltage of 500 V to 1 kV is applied, the metal and glass are chemically bonded together at the interface.

After anodic bonding, the multiple piezoelectric devices thus formed on the wafer sandwich are cut from the sandwich by cutting along the cutting sections 40 (extending along the edges of the external electrodes 26) using a dicing saw. By thus forming multiple piezoelectric devices simultaneously on one wafer, small parts are not necessarily handled during manufacture. As a result, manufacturing steps are simplified or eliminated, and costs reduced.

In the described embodiment, the lid wafer LW is made of glass. Alternatively it can be made of a metal material such as silicon. If silicon is used for the lid wafer LW, anodic bonding can be conducted without having to form the metal film 15. If the base wafer BW and lid wafer LW are bonded together using an epoxy resin (instead of anodic bonding), even if the lid wafer LW is made of glass, the metal film 15 is not necessary.

Moreover, the base wafer BW and the lid wafer LW can be made of a crystal material. If they are made of crystal material, they can be bonded together using a siloxane bonding method.

While preferred embodiments and examples of the current invention have been described above, it will be understood by those skilled in the art that additional modifications and changes can be made to the embodiments and examples without departing from the spirit of the invention. For example, a tuning-fork piezoelectric vibrating piece can be used instead of the AT vibrating piece. Also, whereas borosilicate glass was used for forming the glass package base 20, another glass material such as Pyrex® glass or soda glass can be used instead.

What is claimed is:

1. A piezoelectric device, comprising:
a piezoelectric vibrating piece;
a package containing the piezoelectric vibrating piece,
the package comprising (a) a package base comprised of glass, having first and second opposing surfaces, a cavity defined on the first surface, and at least one through-hole on the second surface, (b) at least one mounting electrode, formed having a hemispherical shape, wherein an electrically conductive adhesive is applied on the surface of the at least one mounting electrode to achieve bonding thereto of a respective connecting electrode of the piezoelectric vibrating piece, (c) a respective sealing electrode, formed having a conical shape, that electrically connects to the at least one mounting electrode and seals the through-hole, (d) at least one external electrode situated on the second surface and electrically connected to the respective sealing electrode, and (e) a package lid comprising glass or silicon, bonded to the package base,
wherein the at least one mounting electrode, the at least one sealing electrode, and the at least one external electrode are integral with each other by a conductive glass paste having resistance to a temperature higher than a temperature at which the package lid is bonded to the package base, the conductive glass paste and package base having substantially equal respective coefficients of thermal expansion.

2. The device of claim 1, wherein:
the package base is comprised of borosilicate glass;
the package lid further comprises a metal film thereon; and
the package base and the package lid are bonded together by anodic bonding.

3. The device of claim 1, wherein the package base and the package lid are bonded together by epoxy resin.

4. The device of claim 1, wherein the package base and the lid are bonded together by a low-melting-point glass.

* * * * *